(12) United States Patent
Frougier et al.

(10) Patent No.: US 9,991,352 B1
(45) Date of Patent: Jun. 5, 2018

(54) METHODS OF FORMING A NANO-SHEET TRANSISTOR DEVICE WITH A THICKER GATE STACK AND THE RESULTING DEVICE

(71) Applicant: GLOBALFOUNDRIES Inc., Grand Cayman (KY)

(72) Inventors: Julien Frougier, Albany, NY (US); Ali Razavieh, Albany, NY (US); Ruilong Xie, Niskayuna, NY (US); Steven Bentley, Menands, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days. days.

(21) Appl. No.: 15/651,282

(22) Filed: Jul. 17, 2017

(51) Int. Cl.
| | |
|---|---|
| *H01L 29/76* | (2006.01) |
| *H01L 29/423* | (2006.01) |
| *H01L 29/78* | (2006.01) |
| *H01L 29/66* | (2006.01) |
| *H01L 29/06* | (2006.01) |

(52) U.S. Cl.
CPC .... *H01L 29/42364* (2013.01); *H01L 29/0665* (2013.01); *H01L 29/6656* (2013.01); *H01L 29/66545* (2013.01); *H01L 29/78* (2013.01)

(58) Field of Classification Search
USPC ... 257/57, 59, 72, 83, 439, 443, 655, E27.1, 257/E27.125, E27.112, E29.117, E29.147, 257/E29.151, E29.182, E29.202, 257/E29.273–E29.299, E29.134, E29.32, 257/E23.016, E21.094, E21.104, E21.121, 257/E21.372, E21.411–E21.416, 66, 257/E21.7, E29.003, E29.295, 213–413, 257/900, 902, 903, E21.19–E21.21, 257/E21.394–E21.458, E21.615–E21.694; 438/30, 48, 128, 149, 151, 157, 161, 283
See application file for complete search history.

(56) References Cited

U.S. PATENT DOCUMENTS

| | | | |
|---|---|---|---|
| 9,812,449 B2 * | 11/2017 | Obradovic | ............ H01L 27/088 |
| 2017/0213911 A1 * | 7/2017 | Balakrishnan | ...... H01L 29/7848 |

* cited by examiner

*Primary Examiner* — Tram H Nguyen
(74) *Attorney, Agent, or Firm* — Amerson Law Firm, PLLC

(57) ABSTRACT

A method that includes forming a patterned stack of materials comprising at least one channel semiconductor material layer and first and second layers of sacrificial material positioned above and below, respectively, the at least one channel semiconductor material layer, forming a replacement gate cavity above the patterned stack of materials and performing an etching process through the gate cavity to selectively remove at least a portion of the first and second layers of sacrificial material relative to the at least one channel semiconductor material layer. The method further includes performing a second etching process to form a reduced-thickness portion of the channel semiconductor material layer that has a final thickness that is less than the initial thickness and forming a replacement gate structure around at least the reduced-thickness portion of the channel semiconductor material layer.

20 Claims, 14 Drawing Sheets

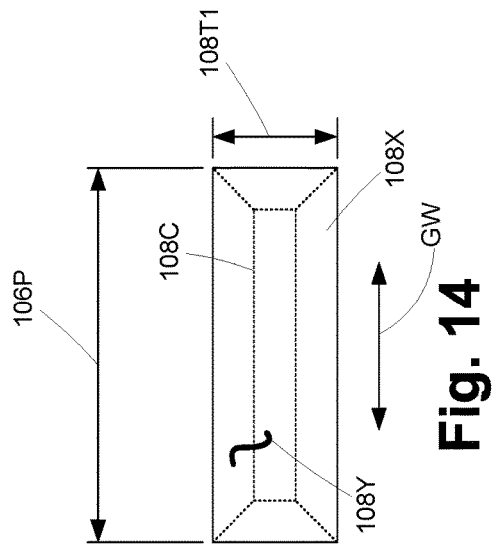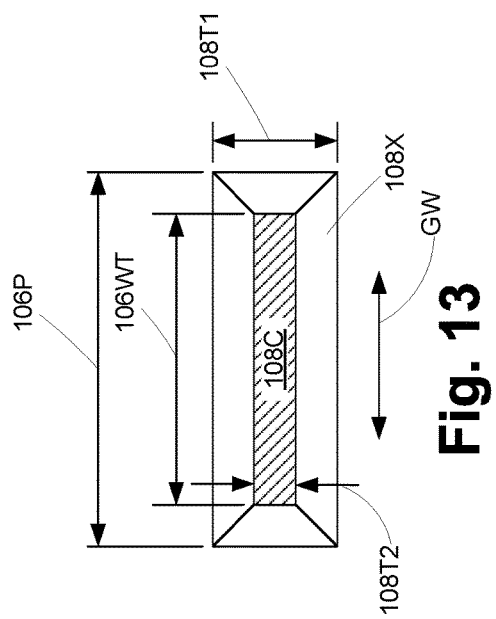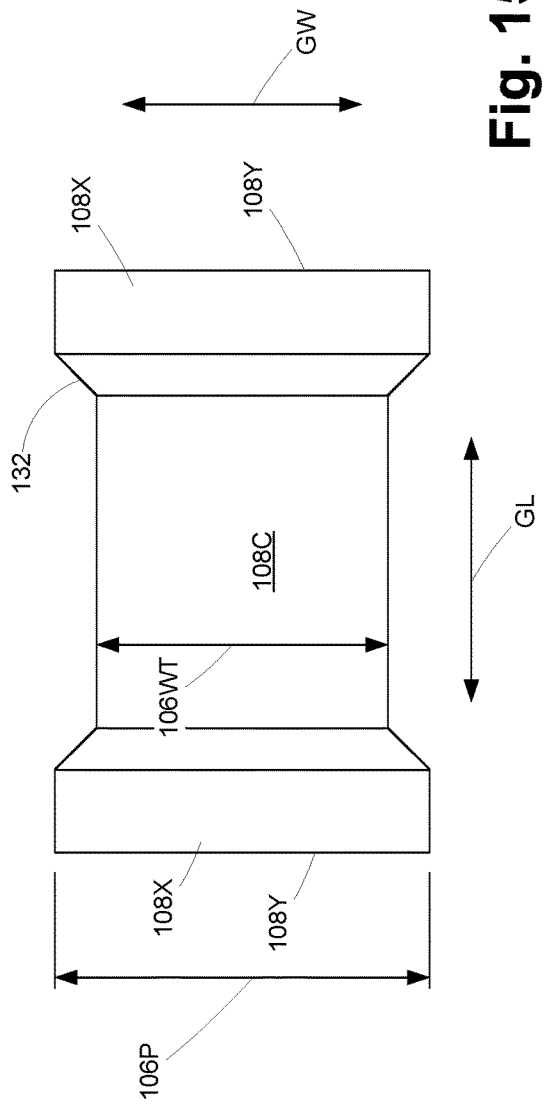

METHODS OF FORMING A NANO-SHEET TRANSISTOR DEVICE WITH A THICKER GATE STACK AND THE RESULTING DEVICE

BACKGROUND OF THE INVENTION

1. Field of the Invention

The present disclosure generally relates to the fabrication of integrated circuits, and, more particularly, to various methods of forming a nano-sheet transistor device with a thicker gate stack and the resulting device.

2. Description of the Related Art

In modern integrated circuits, such as microprocessors, storage devices and the like, a very large number of circuit elements, especially transistors, are provided on a restricted chip area. Transistors come in a variety of shapes and forms, e.g., planar transistors, FinFET transistors, nano-sheet devices, nano-wire devices, etc. A conventional FET is a planar device wherein the entire channel region of the device is formed parallel and slightly below the planar upper surface of the semiconducting substrate. In contrast to a planar FET, there are so-called 3D devices, such as a FinFET device, which is a three-dimensional structure.

The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices. Irrespective of the physical configuration of the transistor device, each transistor device comprises laterally spaced apart drain and source regions that are formed in a semiconductor substrate, a gate electrode structure positioned above the substrate and between the source/drain regions, and a gate insulation layer positioned between the gate electrode and the substrate. Upon application of an appropriate control voltage to the gate electrode, a conductive channel region forms between the drain region and the source region and current flows from the source region to the drain region.

One type of device that shows promise for advanced IC products of the future is generally known as a nano-sheet device. In general, a nano-sheet device has a fin-type channel structure that is comprised of a plurality of vertically spaced-apart sheets of semiconductor material. A gate structure for the device is positioned around each of these spaced-apart layers of channel semiconductor material. Such a nano-sheet device may be formed as part of a high speed logic circuit. Typically, the nano-sheet device may be operated at a relatively low voltage, e.g., 1 V or less (based on today's technology), and it is specifically designed for high-speed operation and low-power consumption (especially for IC products that are employed in mobile devices like smartphones).

There is a constant demand to improve the functionality of IC products which typically involves the formation of more complex circuitry. To produce such advanced IC products, product designers need transistor devices that are specifically designed or tailored to exhibit different operational characteristics, such as threshold voltages, off-state leakage current, power consumption during operation, etc. Such devices give product designers more flexibility and options when it comes to actually designing the circuits for such advanced IC products.

As noted above, transistor devices include a gate structure. The gate structure is typically comprised of at least one gate insulation layer (e.g., silicon dioxide, a high-k material (k value greater than 10), etc.) and one or more layers of conductive material, such as metal or metal-containing layers (e.g., a work-function adjusting layer) that function as the conductive gate electrode for the transistor. The materials for the gate structure may be different depending upon the type of device (e.g., N-type or P-type) under construction. Additionally, the number of layers of material that collectively define the gate structure may be different for different types of devices. Various operational characteristics of a transistor device, such as threshold voltage, leakage currents, etc., may be controlled by adjusting the number, composition and/or thickness of one or more of the layers of material that collectively define the gate structure or gate stack. For example, to produce a device that exhibits low leakage currents, it may be desirable to form the transistor with a relatively thick gate insulation layer. However, as device dimensions have continued to shrink, the physical size of the space where the gate structure for a nano-sheet device (and other types of devices as well) has become extremely small, thereby making it difficult to physically fit all of the materials for the gate structure in the allotted physical space. Additionally, the relatively small size of the physical space for the gate structure on a nano-sheet device may reduce the options available to a device designer to produce a device with the desired operational characteristics.

The present disclosure is directed to various novel methods of forming a nano-sheet transistor device with a thicker gate stack and the resulting novel device that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of forming a nano-sheet transistor device with a thicker gate stack and the resulting novel device. One illustrative method disclosed herein includes, among other things, forming a patterned stack of materials above a semiconductor substrate, the patterned stack of materials comprising at least one channel semiconductor material layer and first and second layers of sacrificial material positioned above and below, respectively, the at least one channel semiconductor material layer, the at least one channel semiconductor material having an initial thickness, forming a replacement gate cavity above the patterned stack of materials, and performing at least one first etching process through the replacement gate cavity to selectively remove at least a portion of the first and second layers of sacrificial material exposed by the formation of the replacement gate cavity relative to the at least one channel semiconductor material layer. In this particular example, the method further includes performing at least one second etching process through the replacement gate cavity to reduce the initial thickness of a portion of the at least one channel semiconductor material layer exposed by the removal of the at least a portion of the first and second layers of sacrificial material to thereby produce a reduced-thickness portion of the at least one channel semiconductor material layer that has a final thickness that is less than the initial thickness, and forming a replacement gate structure within the gate cavity and around at least the reduced-thickness portion of the at least one channel semiconductor material layer.

One illustrative nano-sheet device disclosed herein includes, among other things, a gate structure, a sidewall spacer positioned adjacent the gate structure and a channel semiconductor material layer. In this illustrative example, the channel semiconductor layer comprises first and second portions (having an initial thickness) and a reduced-thickness portion positioned laterally between the first and second portions. In this embodiment, the reduced-thickness portion has a final thickness that is less than the initial thickness and at least a portion of the reduced-thickness portion is positioned vertically under the gate structure, while at least a portion of each of the first and second portions is positioned vertically under the sidewall spacer. The gate structure is positioned around at least a portion of the reduced-thickness portion of the channel semiconductor material layer.

BRIEF DESCRIPTION OF THE DRAWINGS

The disclosure may be understood by reference to the following description taken in conjunction with the accompanying drawings, in which like reference numerals identify like elements, and in which:

FIGS. 1-16 depict various novel methods disclosed herein for forming a nano-sheet transistor device with a thicker gate stack and the resulting novel device.

Figure 1:
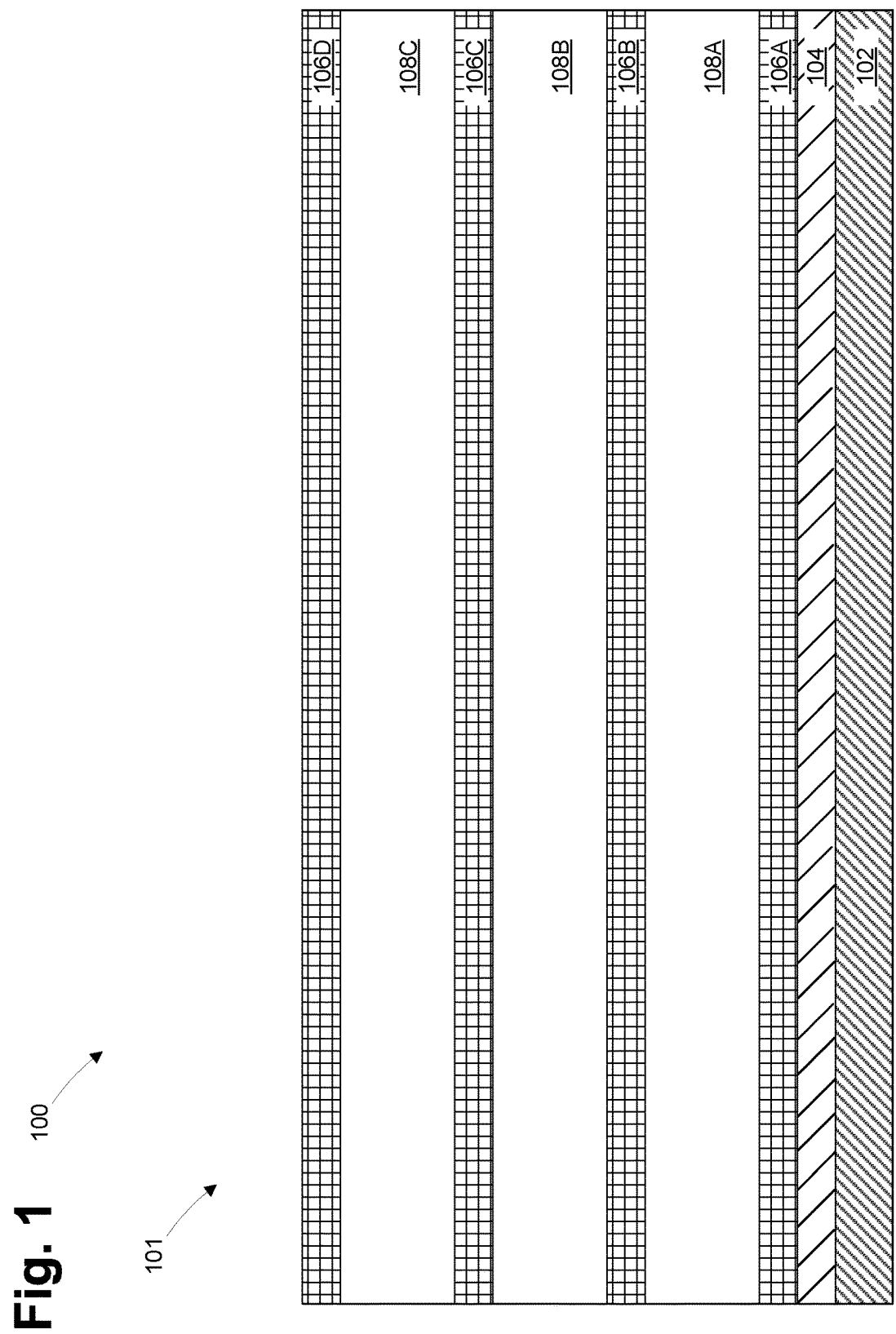

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods and devices disclosed herein may be employed in manufacturing IC products using a variety of technologies, e.g., NMOS, PMOS, CMOS, etc., and they may be employed in manufacturing a variety of different products, e.g., memory products, logic products, ASICs, etc. The gate structure of the nano-sheet transistor device 100 disclosed herein may be formed using "replacement gate" manufacturing techniques. Of course, the inventions disclosed herein should not be considered to be limited to the illustrative examples depicted and described herein. As will be appreciated by those skilled in the art after a complete reading of the present application, various doped regions, e.g., source/drain regions, halo implant regions, well regions and the like, are not depicted in the attached drawings. The various components and structures of the integrated circuit devices 100 disclosed herein may be formed using a variety of different materials and by performing a variety of known techniques, e.g., a chemical vapor deposition (CVD) process, an atomic layer deposition (ALD) process, a thermal growth process, epi deposition, spin-coating techniques, etc. With reference to the attached figures, various illustrative embodiments of the methods and devices disclosed herein will now be described in more detail.

FIGS. 1-16 depict various novel methods disclosed herein for forming a nano-sheet transistor device 100 with a thicker gate stack and the resulting novel device. In the examples depicted herein, the nano-sheet transistor device 100 will be formed in and above a semiconductor substrate 102. The substrate 102 may have a variety of configurations, such as the depicted bulk silicon configuration. The substrate 102 may also have a silicon-on-insulator (SOI) configuration that includes a bulk silicon layer, a buried insulation layer and an active layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials.

FIG. 1 is a simplistic plan view of one illustrative embodiment of the device 100 at an early stage of fabrication. FIG. 1 depicts the device 100 at a point wherein several layers of material have been sequentially formed across substantially the entire substrate 102 by performing multiple epitaxial growth processes to produce or define a stack of materials 101. In this depicted example, the device 100 is comprised of a first sacrificial material layer 104, a plurality of second sacrificial material layers 106A-D (collectively referenced by use of the numeral 106) and a plurality of channel semiconductor material layers 108A-C (collectively referenced by use of the numeral 108). In this particular embodiment, for reasons that will be described more fully below, the first sacrificial material layer 104 should be made of a material that may be selectively removed (by etching) relative to both the second sacrificial material layers 106 and the channel semiconductor material layers 108. Similarly, for reasons that will be described more fully below, the second sacrificial material layers 106 should be made of a material that may be selectively removed (by etching) relative to the channel semiconductor material layers 108. When the device is completed, portions of the channel semiconductor material layers 108 will constitute the channel structure for the device 100. In one illustrative embodiment, the first sacrificial material layer 104 and the second sacrificial material layers 106 may both be comprised of silicon germanium, wherein the germanium concentration in the layers are sufficiently different so as to permit selective etching of the layers relative to one another. In one particular embodiment, the first sacrificial material layer 104 may be comprised of $Si_{x1}Ge_{y1}$ and the second sacrificial material layers 106 may be comprised of $Si_{x2}Ge_{y2}$ (where $x_1+y_1=1$; $x_2+y_2=1$; $x_1>0$; $x_2>0$ and $y_1>y_2$ or $y_1<y_2$). In an even more specific illustrative embodiment, the first sacrificial material layer 104 may be comprised of a material such as, for example, $Si_{(0.40)}Ge_{(0.60)}$, the second sacrificial material layers 106 may be made of a material such as, for example, $Si_{(0.75)}Ge_{(0.25)}$, and the channel semiconductor material layers 108 may be made of, for example, substantially pure silicon.

The number and thickness of the layers 104, 106 and 108 within the stack of materials 101 may vary depending upon the particular application. In the example depicted herein, the device will comprise three of the channel semiconductor material layers 108. However, in practice, the device 100 could be formed with any desired number of the channel semiconductor material layers 108, even including a single channel semiconductor material layer 108 (that is positioned between two second sacrificial material layers 106 during the manufacturing process) for a gate-all-around device 100. Additionally, when the stack of materials 101 includes multiple second sacrificial material layers 106, all of the second sacrificial material layers 106 within the stack of materials 101 need not be formed to the same thickness, although that may be the case in some applications. Similarly, when the stack of materials 101 includes multiple channel semiconductor material layers 108, all of the channel semiconductor material layers 108 within the stack of materials 101 need not be formed to the same thickness, although that may be the case in some applications. In the specific illustrative example depicted herein, the first sacrificial material layer 104 is formed with an initial thickness of about 10 nm, all of the second sacrificial material layers 106 are formed with an initial thickness of about 4 nm, and all of the channel semiconductor material layers 108 are formed with an initial thickness of about 13 nm. In general, the initial thickness of the channel semiconductor material layers 108 will be significantly greater than the initial thickness of the second sacrificial material layers 106. In one particular example, the initial thickness of the channel semiconductor material layers 108 may be at least about 1.5-3 times greater than the initial thickness of the second sacrificial material layers 106. The thicknesses selected for the various layers of material 104, 106 and 108 may vary from application to application for a variety of reasons. For example, in some cases, the thicknesses of the layers (considered individually and collectively) may be selected such that the overall height of the stack of materials 101 is consistent with other gate structures for other devices, e.g., FinFET devices, that are formed above the same substrate 102 so as to make subsequent manufacturing steps, such as chemical mechanical polishing (CMP) processes, the fin reveal process for shallow trench isolation (STI) formation, etc., easier to perform. As will be appreciated by those skilled in the art after a complete reading of the present application, the above statement that the channel semiconductor material layers 108 may be about 1.5-3 times greater than the initial thickness of the second sacrificial material layers 106 should not be considered to be restrictive as to the inventions disclosed herein as the relative thicknesses between the layers 108 and 106 may vary depending upon the exact process flow selected.

Of course, after a complete reading of the present application, those skilled in the art will appreciate that, in the case where the substrate 102 is an SOI-type substrate, the first sacrificial material layer 104 would not be present. In the illustrative process flow described herein, the purpose of the first sacrificial material layer 104 is to enable the formation of a bottom dielectric layer, the purpose of which is to provide dielectric isolation of the gate structure and the stack of channel materials from the substrate 102 of a nano-sheet device that is formed on the illustrative bulk substrate 102 depicted in the attached drawings so as to effectively end up with an SOI-like configuration even though the nano-sheet device is fabricated on a bulk substrate 102. Of course, the ultimate purpose of providing such isolation material under the device is to enhance the electrical performance of the device. Even in the case where the nano-sheet device is fabricated on a bulk substrate, the device may be isolated in a variety of different ways that would not involve formation of the first sacrificial material layer 104, i.e., the first sacrificial material layer 104 is an optional layer that may be included or omitted depending upon the precise process flow selected for manufacturing the nano-sheet device. For example, an ion implantation process could be performed to form well-known Punch-Through Stopper (PTS) implant regions in the bulk substrate 102 to neutralize or lessen the undesirable flow of charge carriers.

Figure 2:
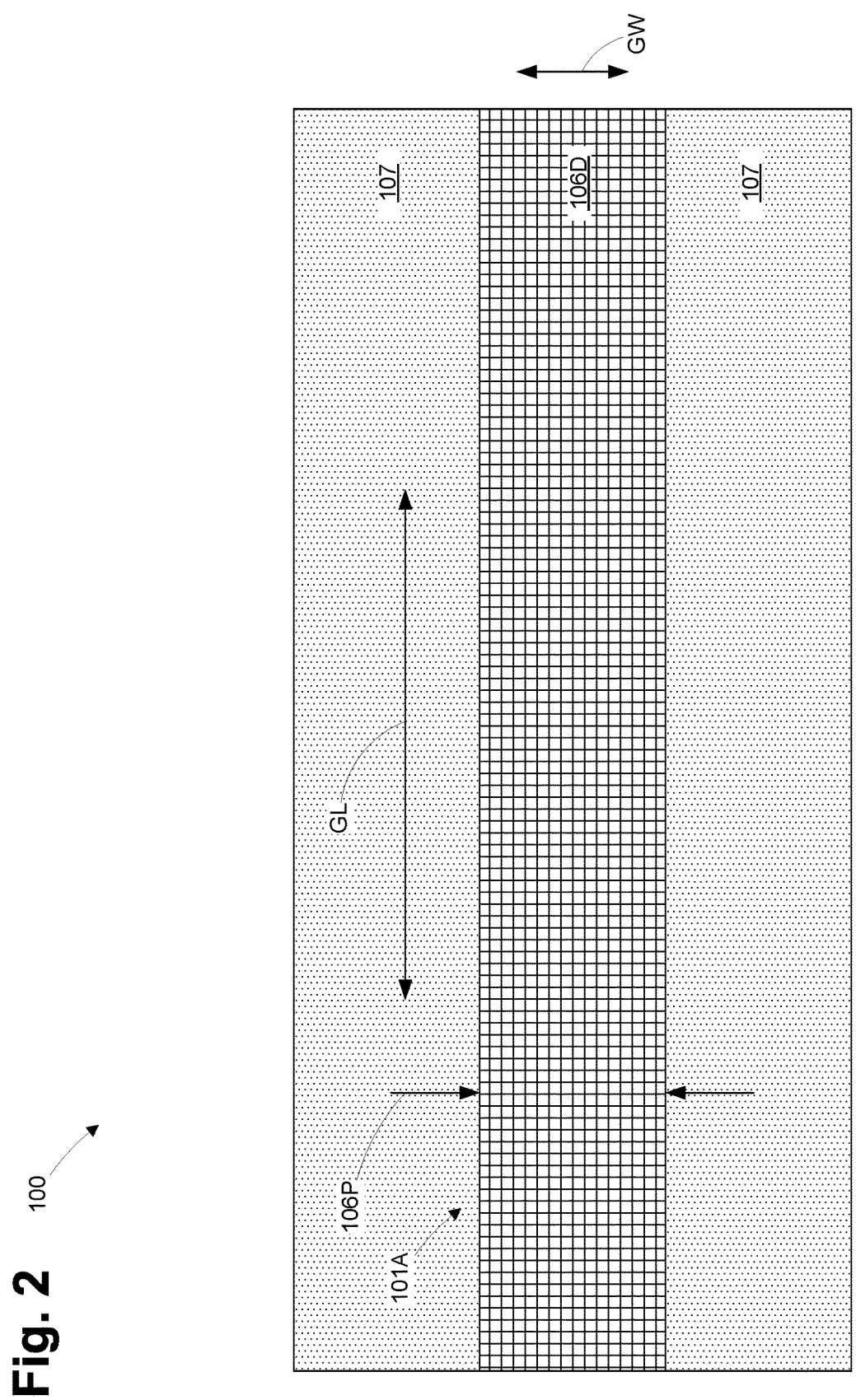

FIG. 2 is a simplistic plan view of the device 100 after several process operations were performed. First, one or more etching processes, e.g., anisotropic etching processes, were performed through a patterned etch mask (not shown) to pattern the stack of materials 101 so as to form an elongated stack of materials 101A having a general fin-like configuration. The patterned stack of materials has a nominal width 106P in the gate width (GW or W) direction of the device 100. This operation results in the formation of a plurality of trenches (not shown) that extend into the substrate 102 on opposite sides of the elongated stack of materials 101A. After the formation of the elongated stack of materials 101A, a layer or layers of insulating material 107 (e.g., silicon dioxide, etc.) was deposited so as to overfill the trenches that were formed in the substrate 102. Of course, the insulating material 107 may be comprised of a single layer of material or multiple layers of material, and these layers or layer may be formed using a variety of techniques and processes known to those skilled in the art, e.g., by performing a flowable CVD process, by performing an ALD process to form a liner comprised of an insulating material, by performing an HDP process to form a high density oxide, etc. Thereafter, a chemical mechanical polishing (CMP) process was performed to planarize the upper surface of the layer of insulating material 107 with the upper surface of the patterned etch mask. Then, a recess etching process was performed on the layer of insulating material 107 to reduce its thickness within trenches such that sides of all of the layers of material in the elongated stack of materials 101A are exposed. At that point, the patterned etch mask was removed by performing one or more etching or stripping processes.

As will be appreciated after a complete reading of the present application, FIG. 2 depicts what will become the gate length (GL or $L_g$-current transport) direction of the final device 100 as well as the gate width (GW or W) of the final device 100. Various cross-sectional views depicted in the attached drawings are cross-sections taken through what will become the gate structure of the device 100 in a direction that corresponds to the gate length direction of the device 100. The patterned etch mask may be comprised of one or more layers of material, e.g., a relatively thin layer of silicon dioxide and a relatively thicker layer of silicon nitride, and it may be formed to any desired overall thickness. With continuing reference to FIG. 2, the width and height of the elongated stack of materials 101A may vary depending upon the particular application. Additionally, the overall size, shape and configuration of the trenches formed in the substrate 102 and the elongated stack of materials 101A may vary depending on the particular application. In the illustrative examples depicted in the attached drawings, the elongated stack of materials 101A is depicted as having been formed by performing an anisotropic etching process that results in the elongated stack of materials 101A having a schematically (and simplistically) depicted, generally rectangular configuration with a uniform width 106P for all of the layers in the stack of materials 101A. In an actual real-world device, the sidewalls of the elongated stack of materials 101A may be somewhat outwardly tapered (i.e., the elongated stack of materials 101A may be wider at the bottom of the stack 101A than they are at the top of the stack 101A), although that configuration is not depicted in the attached drawings. Moreover, due to such tapering, the width 106P of each of the individual layers of material within the stack 101A may vary as one proceeds from the uppermost layer of material in the stack 101 toward the bottom of the stack 101A, e.g., the width 106P of the layer 106D may be less than the width 106P of the layer 106A (to at least some degree). Thus, the size and configuration of the elongated stack of materials 101A, and the manner in which it is made, should not be considered a limitation of the present invention. For ease of disclosure, only the substantially rectangular elongated stack of materials 101A will be depicted in the subsequent drawings.

Figure 3:
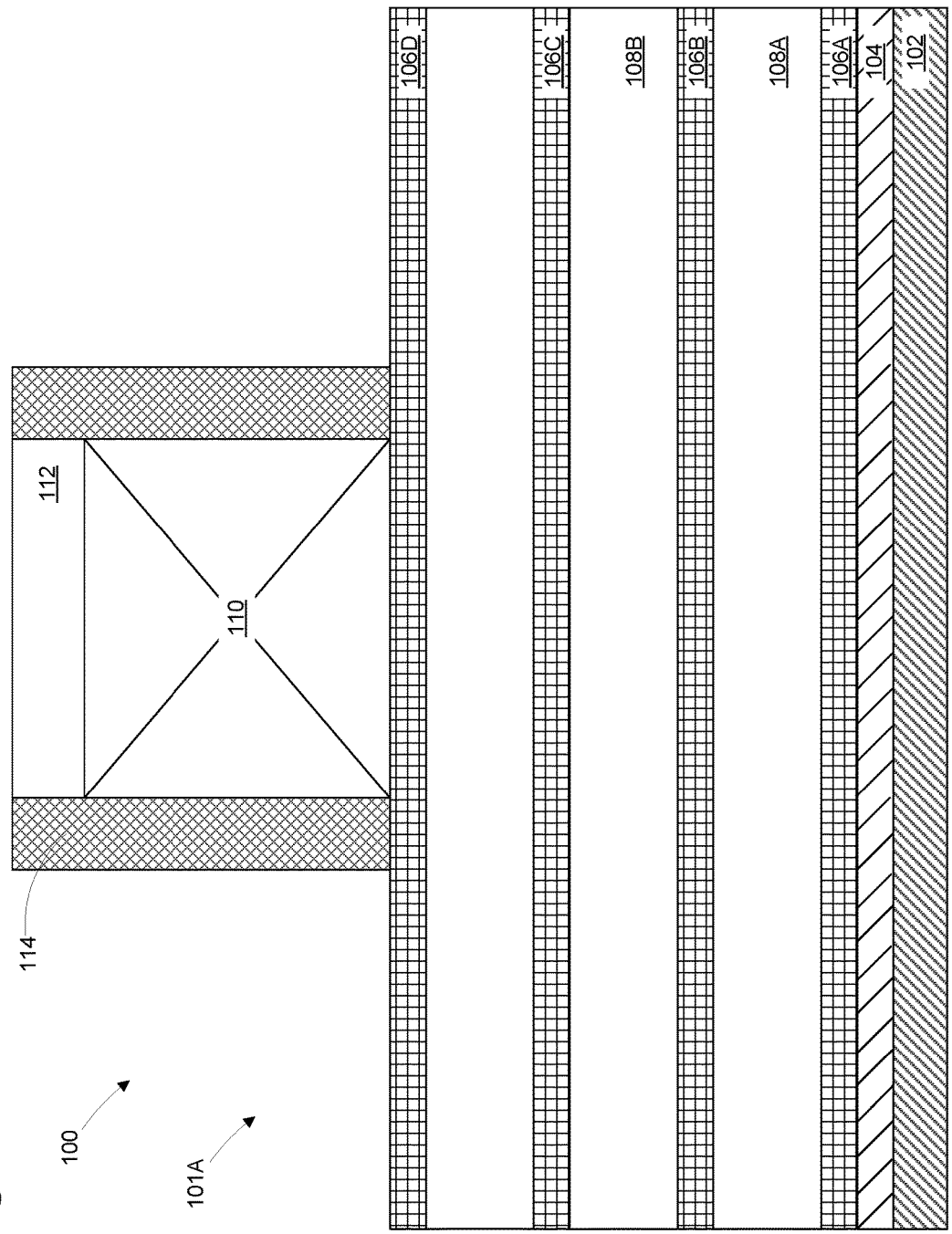
Figure 4:
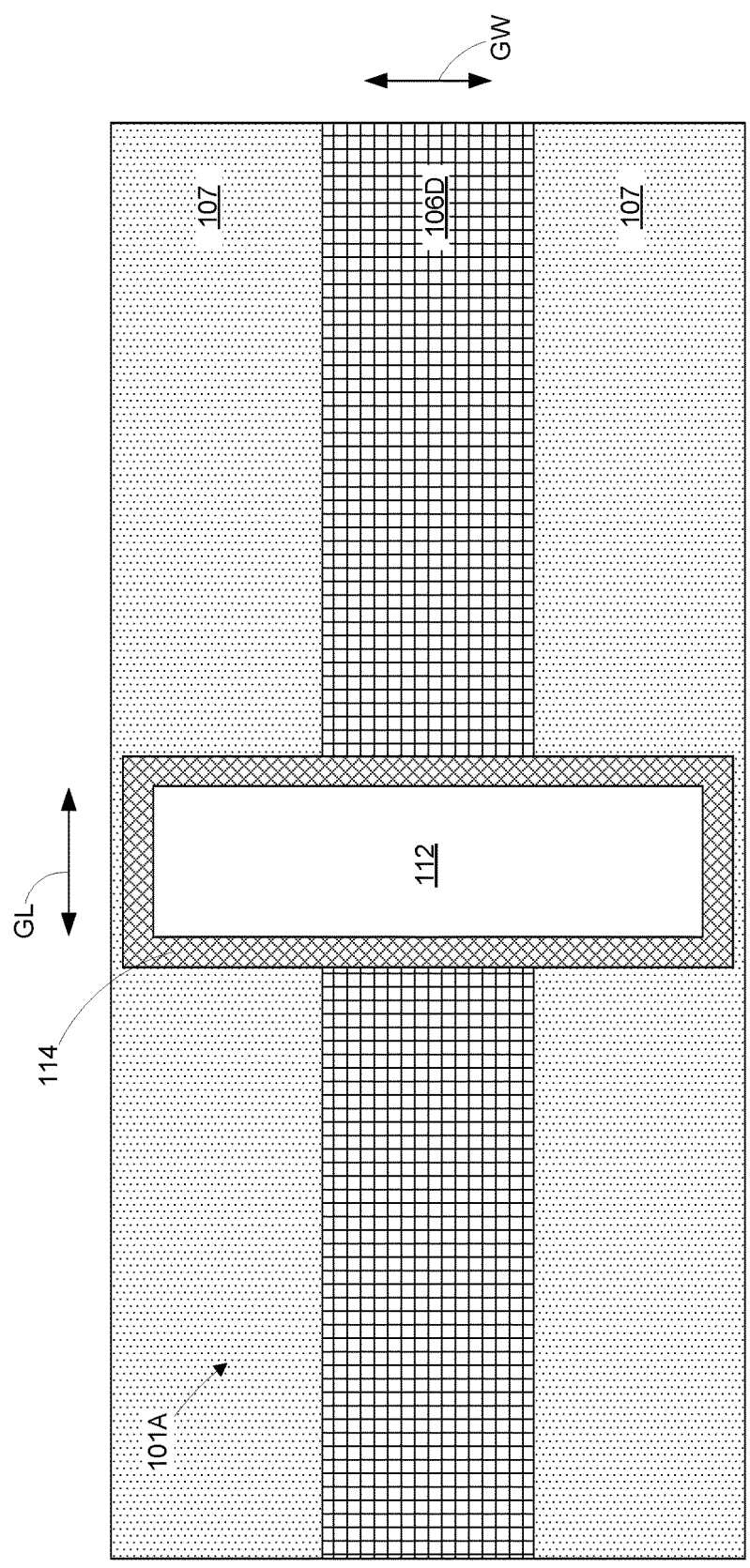

FIGS. 3 and 4 (plan view) depict the device 100 after several process operations were performed. In the illustrative example depicted herein, the final gate structure for the device 100 will be manufactured using replacement gate manufacturing techniques. Accordingly, FIGS. 3 and 4 depict the device 100 after a schematically depicted sacrificial gate structure 110, a gate cap (or hardmask) 112 and a sidewall spacer 114 were formed for the device 100. The sacrificial gate structures 110 may be comprised of a gate insulation layer (not separately shown), e.g., silicon dioxide, and a sacrificial gate electrode (not separately shown) comprised of, for example, amorphous silicon. The sacrificial gate structures 110 and the gate cap (or hardmask) 112 may be formed by performing known deposition, masking and etching techniques. The sidewall spacer 114 may be formed by performing a conformal deposition process to form a conformal layer of spacer material above the sacrificial gate structures 110, the gate cap (or hardmask) 112 and the rest of the substrate 102, and thereafter performing an anisotropic etching process. The sidewall spacer 114 and the gate caps (or hardmasks) 112 may be comprised of a variety of different materials, such as silicon nitride, SiBCN, SiNC, SiN, SiCO, and SiNOC, etc., and they may be made of the same or different materials.

Figure 5:
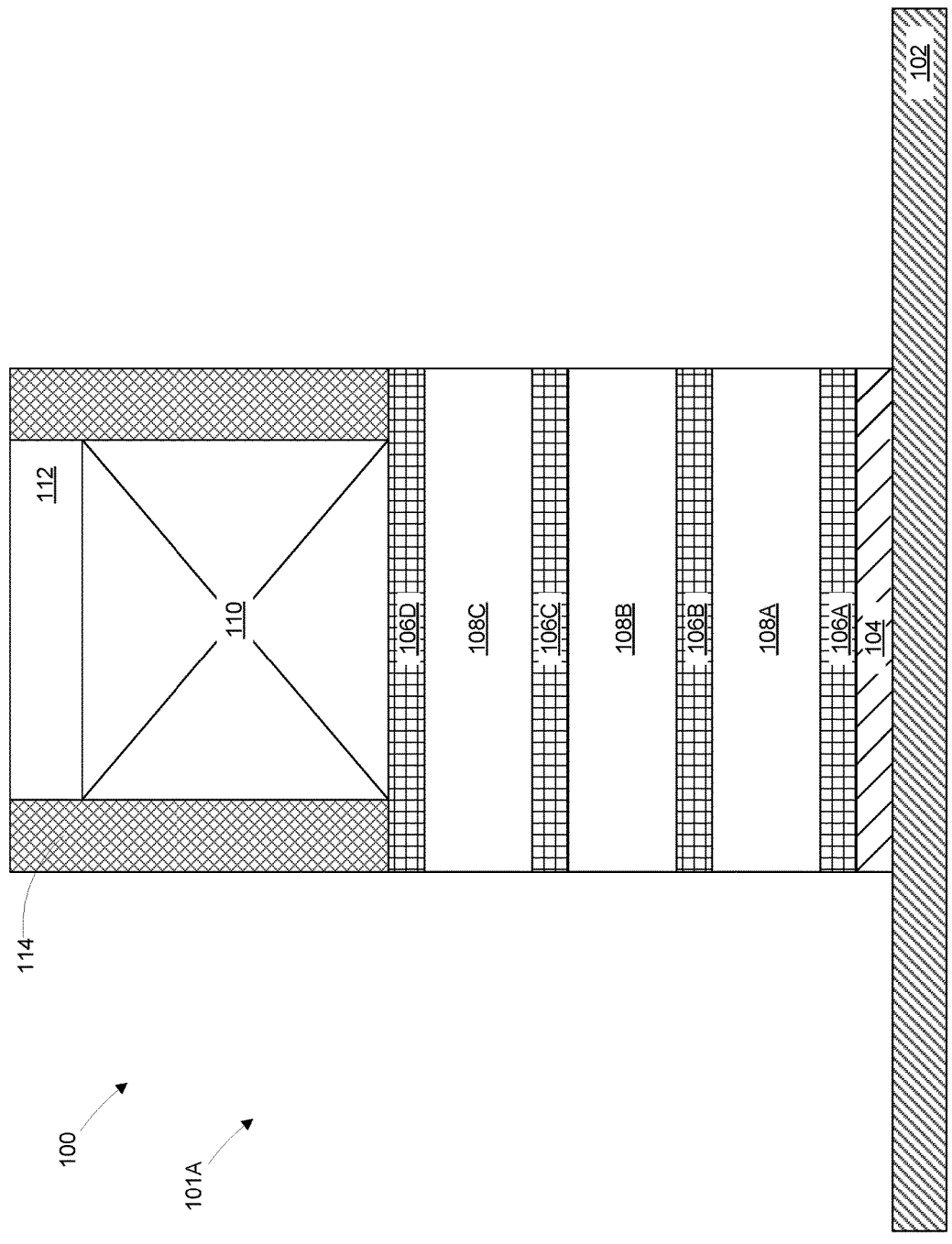
Figure 6:
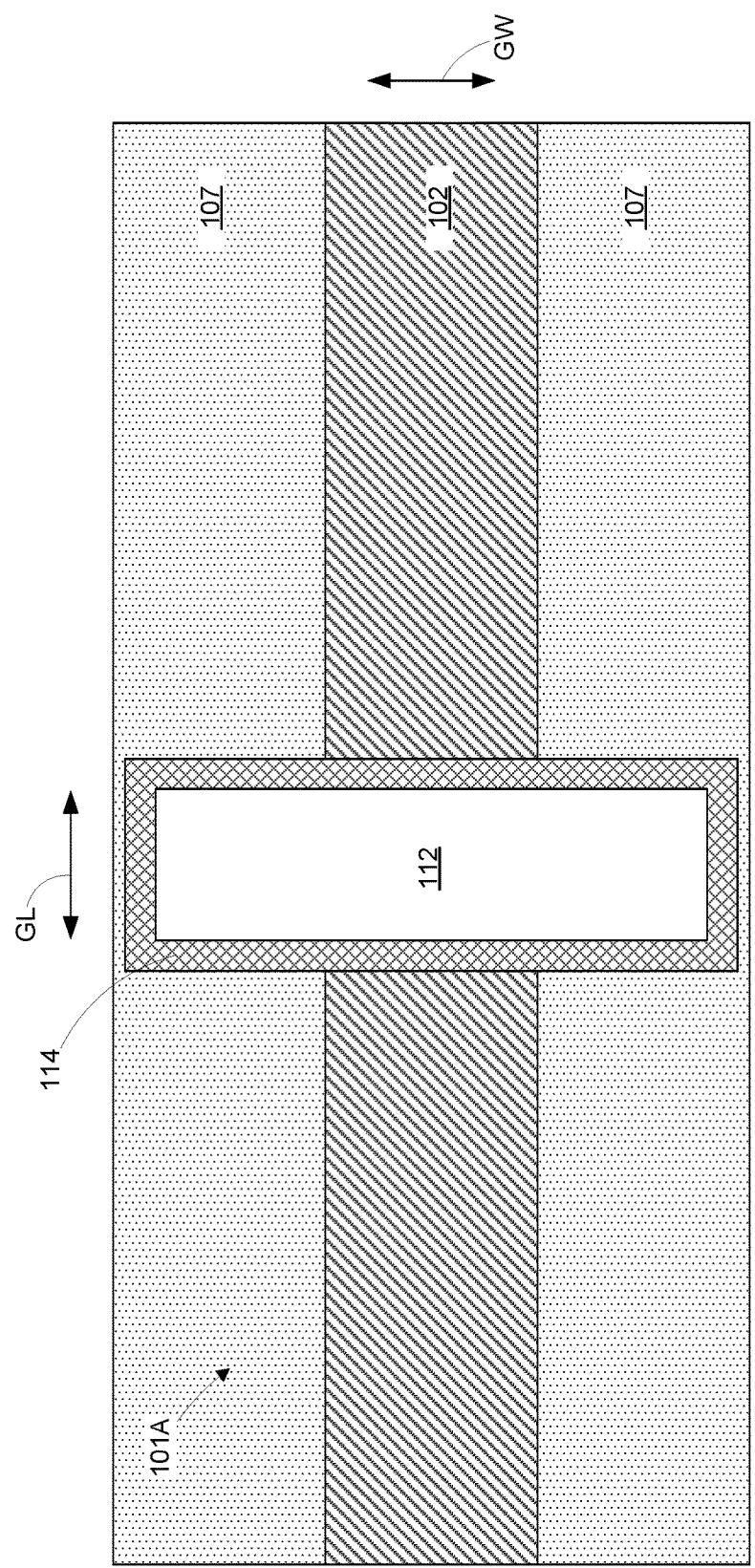

FIGS. 5 and 6 (plan view) depict the device 100 after several process operations were performed. First, one or more etch processes were performed to remove all of the layers of material in the elongated stack of materials 101A that are not covered by the sacrificial gate structures 110 and the spacer 114. In one embodiment, the etching processes may be anisotropic etching processes. As depicted in FIG. 5, these etching processes are substantially self-aligned with respect to the spacer 114. Also note that, as shown in FIG. 6, after the completion of these etching processes, portions of the substrate 102 that were previously covered by the now-removed portions of the first sacrificial material layer 104 are exposed.

Figure 7:
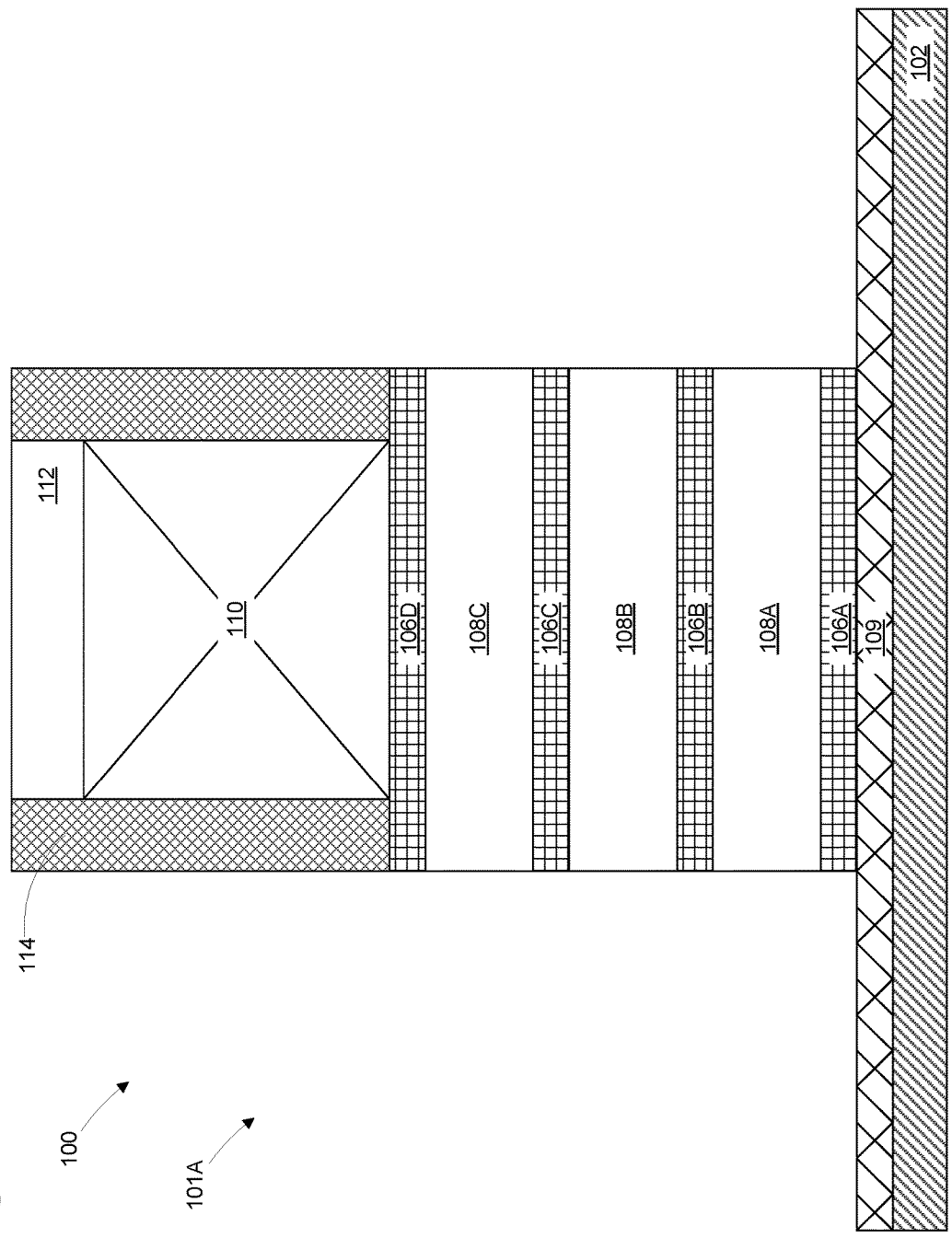

FIG. 7 depicts the device 100 after several process operations were performed. First, an isotropic etching process was performed to selectively remove the first sacrificial material layer 104 relative to the surrounding materials including the second sacrificial material layers 106 and the channel semiconductor material layers 108. Thereafter, a layer of insulating material 109 is formed in the space between the substrate 102 and the lowermost second sacrificial material layer 106A. The layer of insulating material 109 may be formed by any technique or combination of techniques (e.g., conformal ALD, isotropic/anisotropic CVD, HDP, etc.) that enable the formation of a substantially uniform layer of insulating material 109 so as to provide electrical isolation for the channel region and source/drain regions of the device 100. Then, a recess etching process was performed on the layer of insulating material 109 such that it has the final desired thickness and removes any insulating material from the sidewalls of the second sacrificial material layers 106 and the channel semiconductor material layers 108. After a complete reading of the present application, those skilled in the art will appreciate that the above process flow is but one way to form an isolation material under the stack of gate materials shown in FIG. 7.

Figure 8:
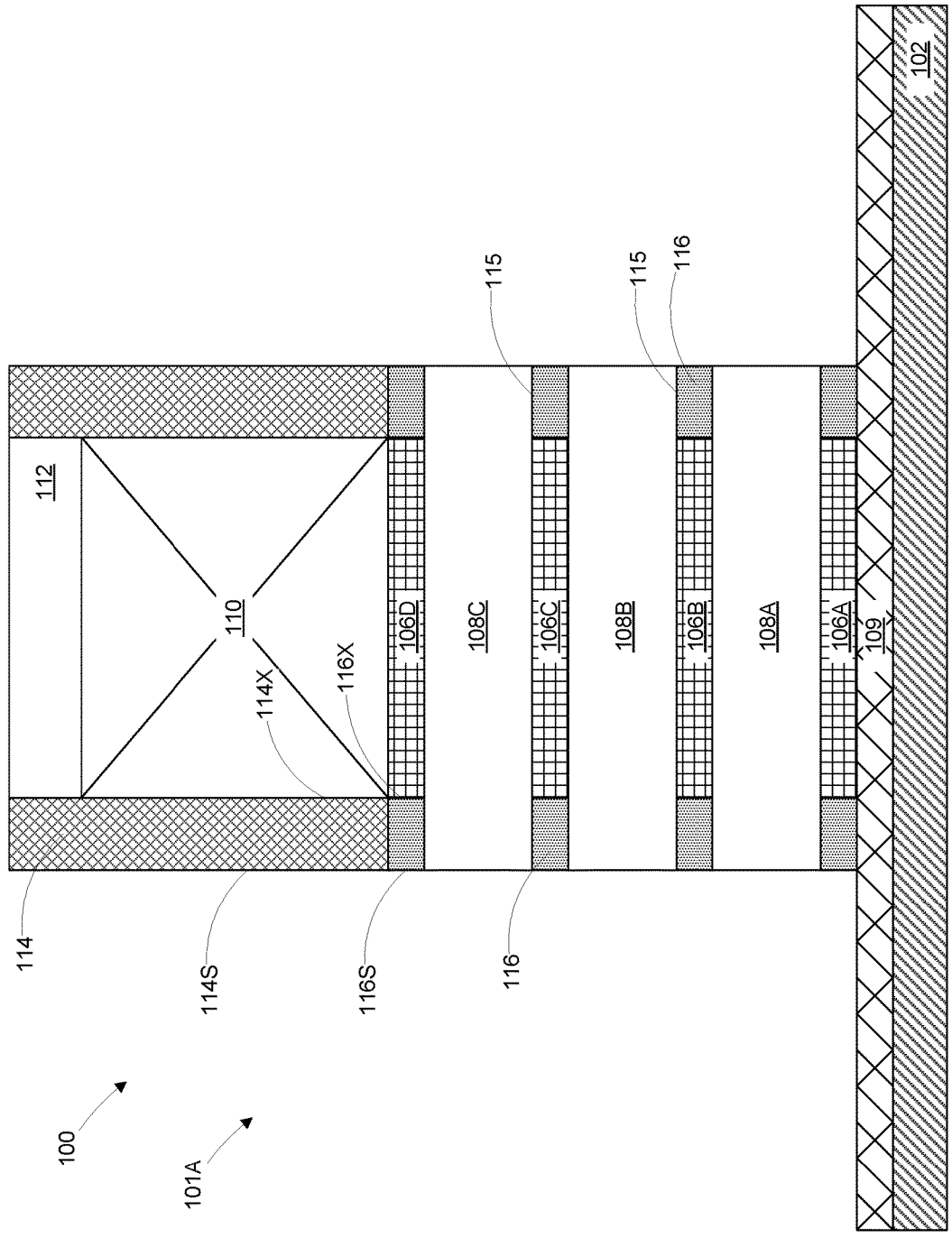

FIG. 8 depicts the device 100 after several process operations were performed. First, a timed isotropic etching process was performed to partially recess the second sacrificial material layers 106 and thereby create or define inner spacer cavities or end recesses 115 between adjacent channel semiconductor material layers 108. Then, a conformal deposition process, such as an ALD process, was performed to form a layer of insulating material (e.g., silicon nitride) so as to substantially fill the end recesses 115. Thereafter, an anisotropic or isotropic etch process was performed to remove any excess material amounts of the insulating material and thereby define or produce inner spacers 116 positioned within the end recesses 115. Note that the outer surfaces 116S of the inner spacers 116 are substantially self-aligned with respect to the outer surfaces 114S of the spacer 114. Additionally, the inner surfaces 116X of the inner spacers 116 may or may not be aligned with the inner surfaces 114X of the spacer 114 depending upon the duration of the above-described isotropic etching process that was performed to partially recess the second sacrificial material layers 106 and thereby define the lateral width of the inner spacer cavities or end recesses 115. As will be described more fully below (see, e.g., FIG. 12) the remaining portions of the second sacrificial material layers 106 will be removed to make room for the final gate structure for the device that will be positioned (among other places) around the channel semiconductor layers 108 and between the inner spacers 116. As will be appreciated by those skilled in the art after a complete reading of the present application, using this process flow permits the second sacrificial material layers 106 to be formed to a relatively small initial thickness as compared to traditional or standard nano-sheet process flows. In turn, the use of the relatively thinner second sacrificial material layers 106 means that the inner spacer cavities or end recesses 115 are much smaller than corresponding inner spacer cavities in prior art flows using thicker sacrificial material layers. Thus, the physically smaller inner spacer cavities or end recesses 115 disclosed herein may be filled by forming a relatively thinner (as compared to prior art process flows) conformal layer of spacer material that will pinch-off in the relatively smaller inner spacer cavities or end recesses 115. The formation of this relatively thinner (as compared to prior art process flows) conformal layer of inner spacer material also means that there is less consumption of the lateral spacing between adjacent devices when the relatively thinner conformal layer of inner spacer material disclosed herein is formed as compared to traditional process flows involving the formation of relatively thicker conformal layers of inner spacer material. Accordingly, the gate spacing (Contacted gate Poly-Pitch (CPP)) may be reduced, as compared to traditional processes, without running the risk that the relatively thinner conformal layer of inner spacer material disclosed herein will pinch-off between adjacent gate structures. The net result is that the process flow disclosed herein has better device scaling potential as compared to traditional nano-sheet process flows.

Figure 9:
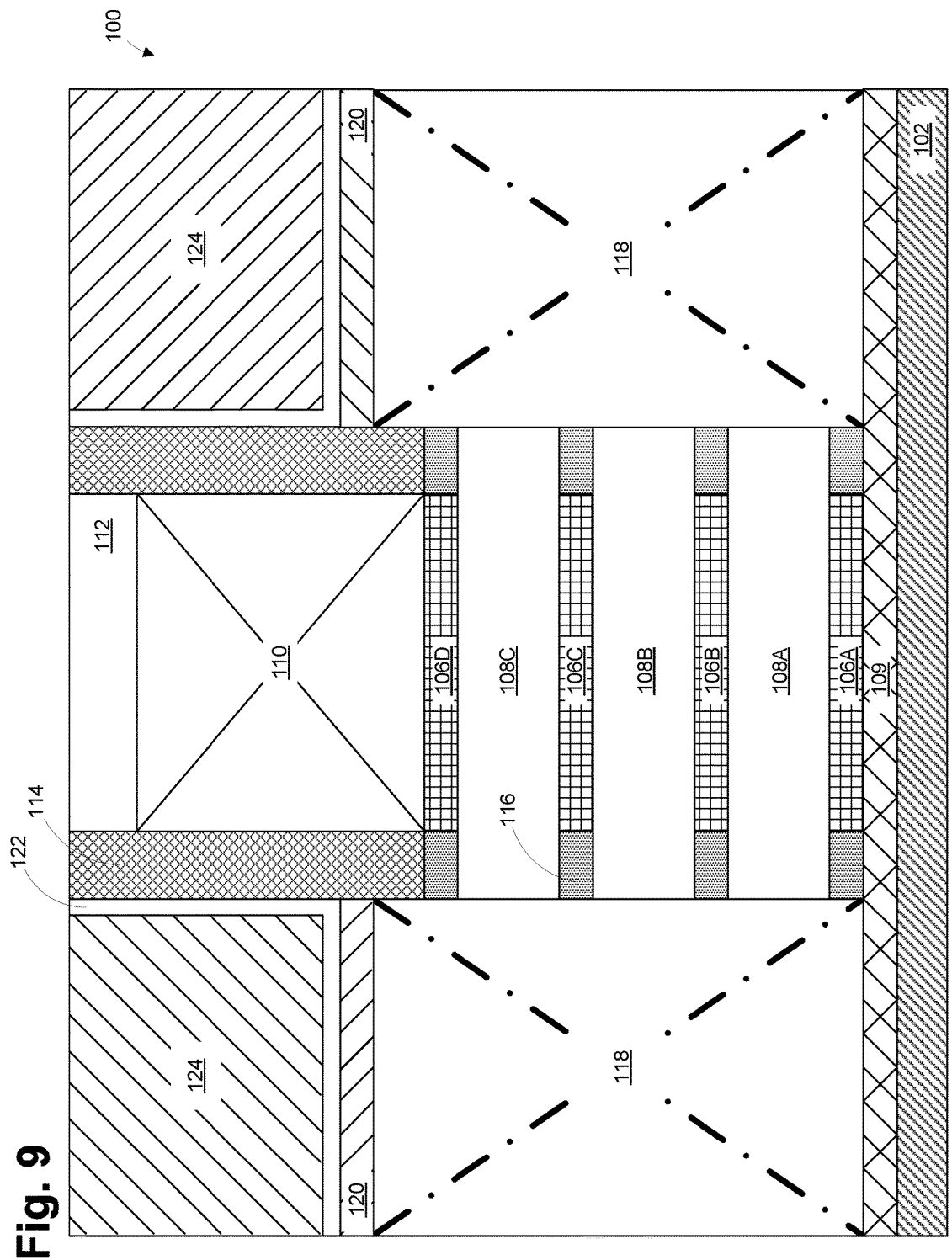

FIG. 9 depicts the device 100 after several process operations were performed. First, an epitaxial growth process was performed to form epi source/drain regions 118 for the device 100 above the layer of insulating material 109. The channel semiconductor material layers 108 serve as growth surfaces or seed areas during this epi growth process. The epi source/drain regions 118 may be comprised of the same semiconductor material as that of the channel semiconductor material layers 108, e.g., silicon) or they may be comprised of a different material, such as, for example, SiGe. Note that, due to the relatively large initial thickness of the channel semiconductor material layers 108, the effective growth areas are relatively larger, thereby favoring/enhancing the nucleation and growth of the source/drain epitaxy regions 118. Hence the mechanism of S/D epi formation can potentially be faster and provide physically larger regions 118 as compared to the situation where relatively thinner layers of channel semiconductor material are formed for a nano-sheet device. The epi source/drain regions 118 may be doped in situ with the appropriate dopant type depending upon the type of device (N or P) under construction.

With continuing reference to FIG. 9, after the formation of the epi source/drain regions 118, illustrative conductive source/drain contact structures 120, e.g., trench silicide structures, were formed on the channel semiconductor material layers 108 by performing known process operations. Thereafter, a conformal deposition process was performed to form a conformal etch stop layer 122 (e.g., silicon nitride) on the device 100. The etch stop layer 122 may be formed to any desired thickness. Then, a layer of insulating material 124 was blanket-deposited on the product so as to over-fill the space above the etch stop layer 122. At that point, one or more CMP processes were performed using the gate cap (or hardmask) 112 as a polish stop layer so as to remove excess amounts of the insulating material 124 and the etch stop layer 122.

Figure 10:
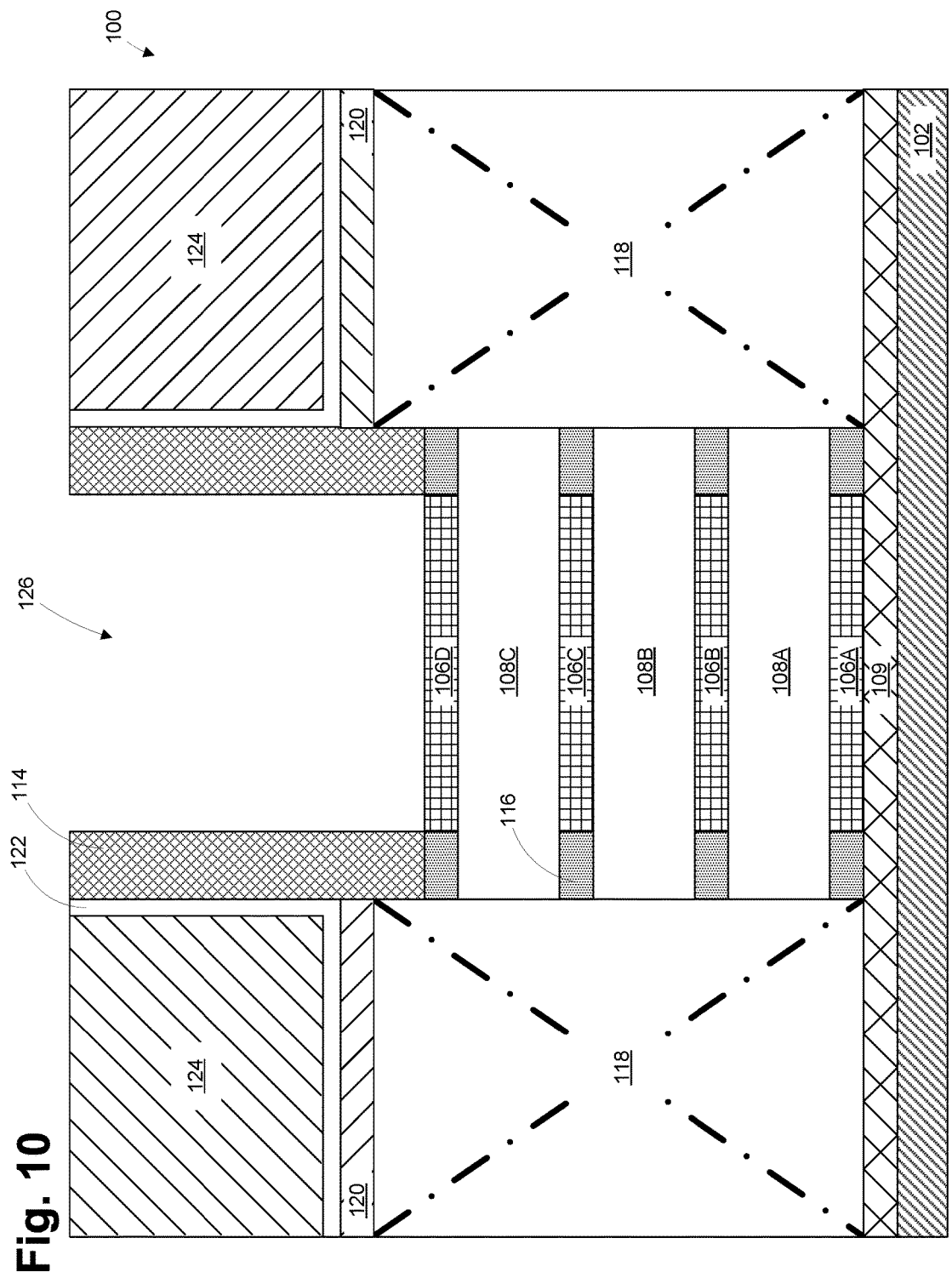

As mentioned above, in the illustrative example depicted herein, the final gate structure for the device 100 will be manufactured using replacement gate manufacturing techniques. Accordingly, FIG. 10 depicts the device 100 after several process operations were performed. First, at least one CMP process plus etching process was performed to remove the gate cap (or hardmask) 112 and vertical portions of the spacer 114, the etch stop layer 122 and the insulating material 124 so as to thereby expose the sacrificial gate structure 110. Then, one or more etching processes were performed to remove the exposed sacrificial gate structure 110. These process operations result in the formation of a replacement gate cavity 126 in the area between the spacer 114. Removal of the sacrificial gate structure 110 also exposes portions of the second sacrificial material layers 106 and the channel semiconductor material layers 108 within the replacement gate cavity 126.

Figure 11:
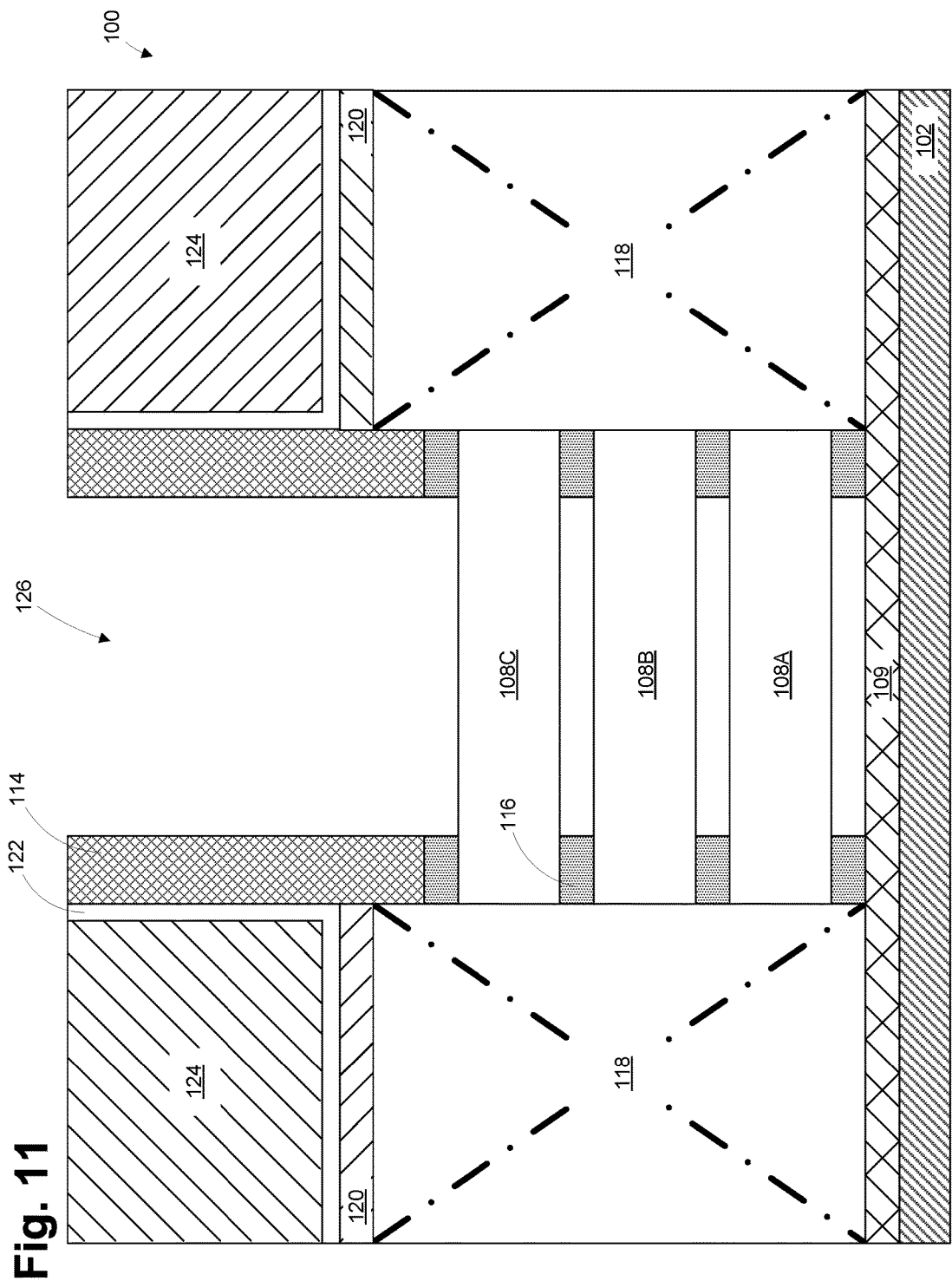

FIG. 11 depicts the device 100 after an isotropic etching process was performed through the replacement gate cavity 126 so as to selectively remove the remaining portions of the second sacrificial material layers 106 relative to the channel semiconductor material layers 108 and the surrounding materials, i.e., to "release" the channel semiconductor material layers 108 and the surrounding materials. Note that the remaining portions of the second sacrificial material layers 106 are removed in both the gate length direction of the device 100 (the direction shown in the cross-sectional view in FIG. 11) and the gate width direction of the device 100, i.e., in a direction into and out of the plane depicted in FIG. 11. As a result of this process operation, the replacement gate cavity 126 now includes the spaces between the released channel semiconductor material layers 108 and inner spacers 116 as well as the space between the spacer 114. Note that the spacer 114 laterally bounds at least a portion of the replacement gate cavity 126.

Figure 12:
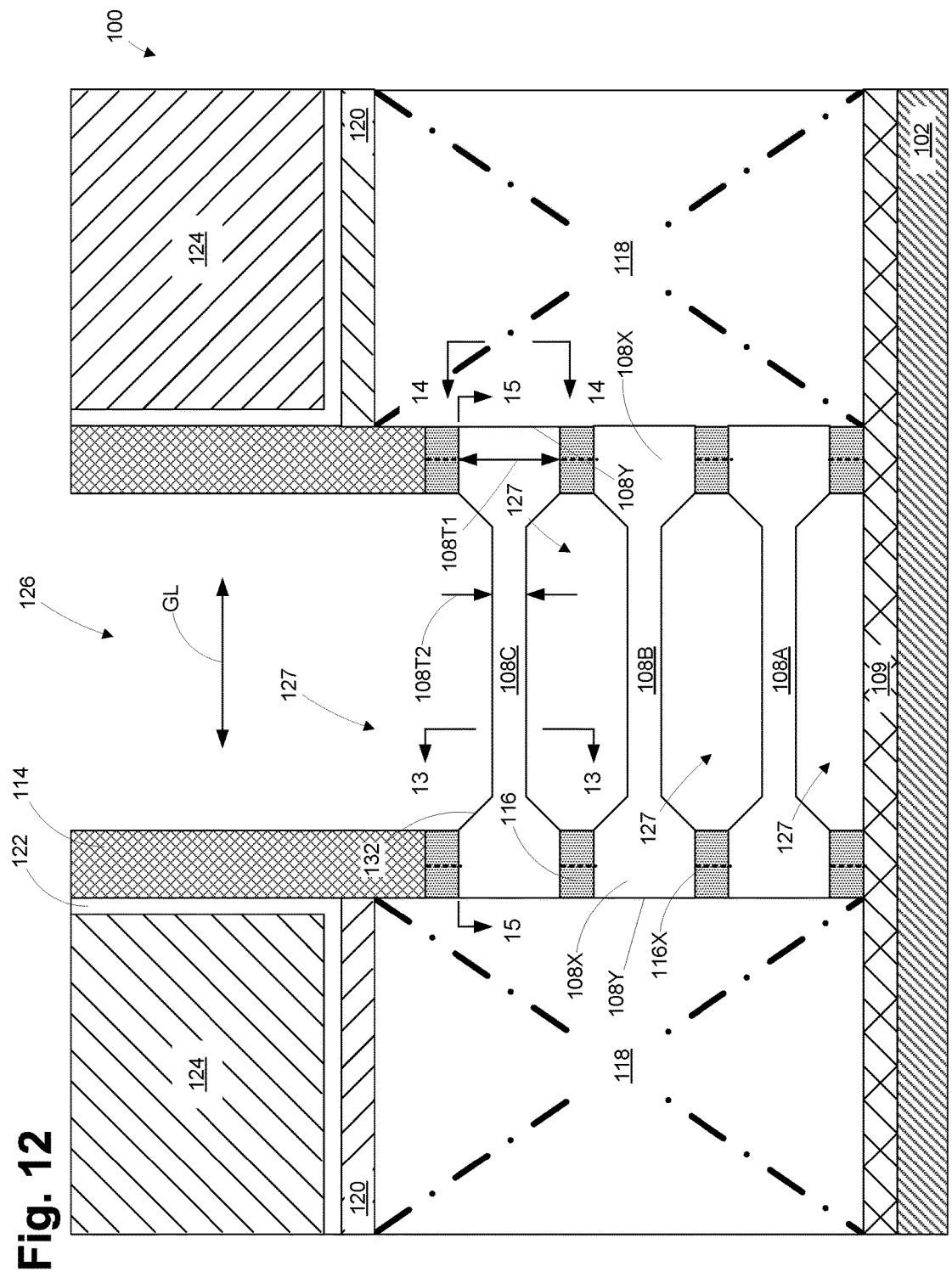

FIG. 12 depicts the device 100 after a thinning or trimming process was performed on the channel semiconductor material layers 108 through the replacement gate cavity 126 so as to reduce the thickness of (or trim) at least a portion of the channel semiconductor material layers 108 exposed within the replacement gate cavity 126. Non-trimmed portions 108X of the channel semiconductor material layers 108 remain positioned between adjacent inner spacers 116. FIG. 13 is a cross-sectional view (taken where indicated in FIG. 12) of the channel semiconductor layer 108C after the trimming process was completed; FIG. 14 is an end view (as shown in FIG. 12) of the channel semiconductor layer 108C after the trimming process was completed; and FIG. 15 is a plan view (as shown in FIG. 12) of the channel semiconductor layer 108C after the trimming process was completed. As shown in FIGS. 12-15, this process operation reduces the thickness of the trimmed portions of the channel semiconductor material layers 108 from their initial vertical thickness 108T1 to a reduced final vertical thickness 108T2, i.e., the trimmed portions of the channel semiconductor material layers 108 have a reduced thickness as compared to the first and second non-trimmed initial thickness portions 108X of the channel semiconductor material layers 108. The amount of trimming performed on the channel semiconductor material layers 108 may vary depending upon the particular application. In one illustrative example, the trimming process may be performed such that the final thickness 108T2 is about 25-50% less than the initial thickness 108T1 of the channel semiconductor material layers 108. As will be appreciated by those skilled in the art after a complete reading of the present application, the above stated range (about 25-50%) should not be considered to be restrictive as to the inventions disclosed herein as the relative decrease (in terms of percentage) between the initial thickness 108T1 and the final thickness 108T2 may vary depending upon the exact process flow selected. For example, the channel semiconductor material layers 108 could be formed with a relatively thin initial thickness 108T1 and then be trimmed by about 5-10% to achieve the targeted final thickness 108T2. Conversely, the channel semiconductor material layers 108 could be formed with a very thick initial thickness 108T1 and then be trimmed by about 80-90% to meet the targeted final thickness 108T2.

Note that, since the sacrificial gate structure 110 was removed before the trimming process is performed, the trimming or size-reduction of the channel semiconductor material layers 108 occurs in both the gate width (GW) and gate length direction (GL) of the device 100. FIGS. 13-15 are various views of the uppermost channel semiconductor layer 108C. As shown therein, the first and second non-trimmed initial thickness portions 108X of the layer 108C have a width 106P (in the gate width direction) that is approximately the same as the width 106P of the layer 108C when it was initially patterned (see FIG. 2), while the trimmed portion of the layer 108C has a lesser width 106WT (in the gate width direction) due to the trimming process. The difference between the width 106WT and the original patterned width 106P depends upon the amount of trimming of the layer 108C. Also note that the non-trimmed portions of the layers 108 have a simplistically depicted substantially rectangular end face 108Y that provides the conduit through which current will flow from the source region, through the channel region and to the drain region. Due to the greater vertical thickness of the initial layers of channel semiconductor materials 108 as compared to prior art devices, the area defined by the end faces of the first and second non-trimmed initial thickness portions 108X of the layers 108 is also larger than in prior art devices. The increased area provided by the relatively larger end faces 108Y may provide significant benefits to the operational characteristics of the device, as discussed more fully below.

Reducing the size or thickness of the channel semiconductor material layers 108 has the effect of creating relatively larger spaces 127 between the thinned channel semiconductor material layers 108 (where gate materials will be formed) as compared to prior art nano-sheet devices that did not perform any trimming of such channel semiconductor material layers, and/or prior art devices that used channel semiconductor material layers that were formed with a substantially lesser initial thickness than the initial thickness 108T1 of the channel semiconductor material layers 108 disclosed herein. Also note that, in some applications, the final trimmed (reduced-thickness) channel semiconductor material layers 108 may also comprise simplistically depicted facets 132 (e.g., (111) facets) that serve as a transition region between the reduced-thickness 108T2 portion of the channel semiconductor material layers 108 and the first and second non-trimmed initial thickness portions 108X of the channel semiconductor material layers 108. In one illustrative example, the channel semiconductor material layers 108 may be trimmed (or reduced in size) by performing a vapor phase HCl etching process, a Frontier process (by Applied Materials) using $H_2$ and $NH_3$ or an inter-layer (IL) process that is a well-controlled oxidation process combined with a well-controlled HF etching process, or any other process permitting well-controlled removal of the material of the channel semiconductor material layers 108.

If desired, prior to performing the trimming process on the channel semiconductor material layers 108, an etching process may be performed through the replacement gate cavity 126 to reduce the lateral width of the inner spacers 116, as reflected by the dashed lines 116X in FIG. 12. This trimming of the inner spacers 116 would also have the effect of further increasing the size of the spaces 127 between the trimmed channel semiconductor material layers 108. Alternatively, with reference to FIG. 8, the same results could be achieved by reducing the size (lateral width) of the end recesses 115 where the inner spacers 116 are formed.

As will be appreciated by those skilled in the art after a complete reading of the present application, after trimming, the first and second non-trimmed initial thickness portions 108X of the channel semiconductor material layers 108 positioned vertically between and under the inner spacers 116 have a thickness that is the same as the initial thickness 108T1 of the channel semiconductor material layers 108. Maintaining this increased thickness 108T1 of the channel semiconductor material layers 108 at locations between the reduced-thickness 108T2 portion of the channel semiconductor material layers 108 and the source/drain regions is very beneficial. In manufacturing the device 100, dopants in the epi source/drain regions 118 need to be driven into at least portions of the first and second non-trimmed initial thickness portions 108X of the channel semiconductor material layers 108 so as to form extension regions between the reduced-thickness 108T2 portion of the channel semiconductor material layers 108 and the source/drain regions 118. Driving of the dopants from the epi source/drain regions 118 is typically accomplished by performing a rapid thermal processing (RTP) process or a laser spike anneal (LSA) process. The electrical resistance of the channel semiconductor material layers 108 is typically referred to as the "extension resistance," wherein a higher extension resistance can reduce or degrade the ON-state current of the device 100, while a lower extension resistance can beneficially increase (or at least not degrade) the ON-state current. Thus, the extension resistance of the device is an important characteristic of the device 100. As noted above, in the process flow described herein, the channel semiconductor material layers 108 are formed with a greater initial thickness 108T1 as compared to the channel semiconductor materials in standard nano-sheet process flows. This operation results in the relatively thicker first and second non-trimmed initial thickness portions 108X (with a thickness 108T1) being positioned under and between the inner spacers 116 and adjacent the source/drain regions 118 as compared to prior art nano-sheet devices. As noted above, the nano-sheet devices disclosed herein have an end face 108Y that has an increased (as compared to prior art devices) effective cross-sectional area available for electrons to flow through the device 100 in the extension regions, thereby reducing the extension resistance of the device.

Figure 16:
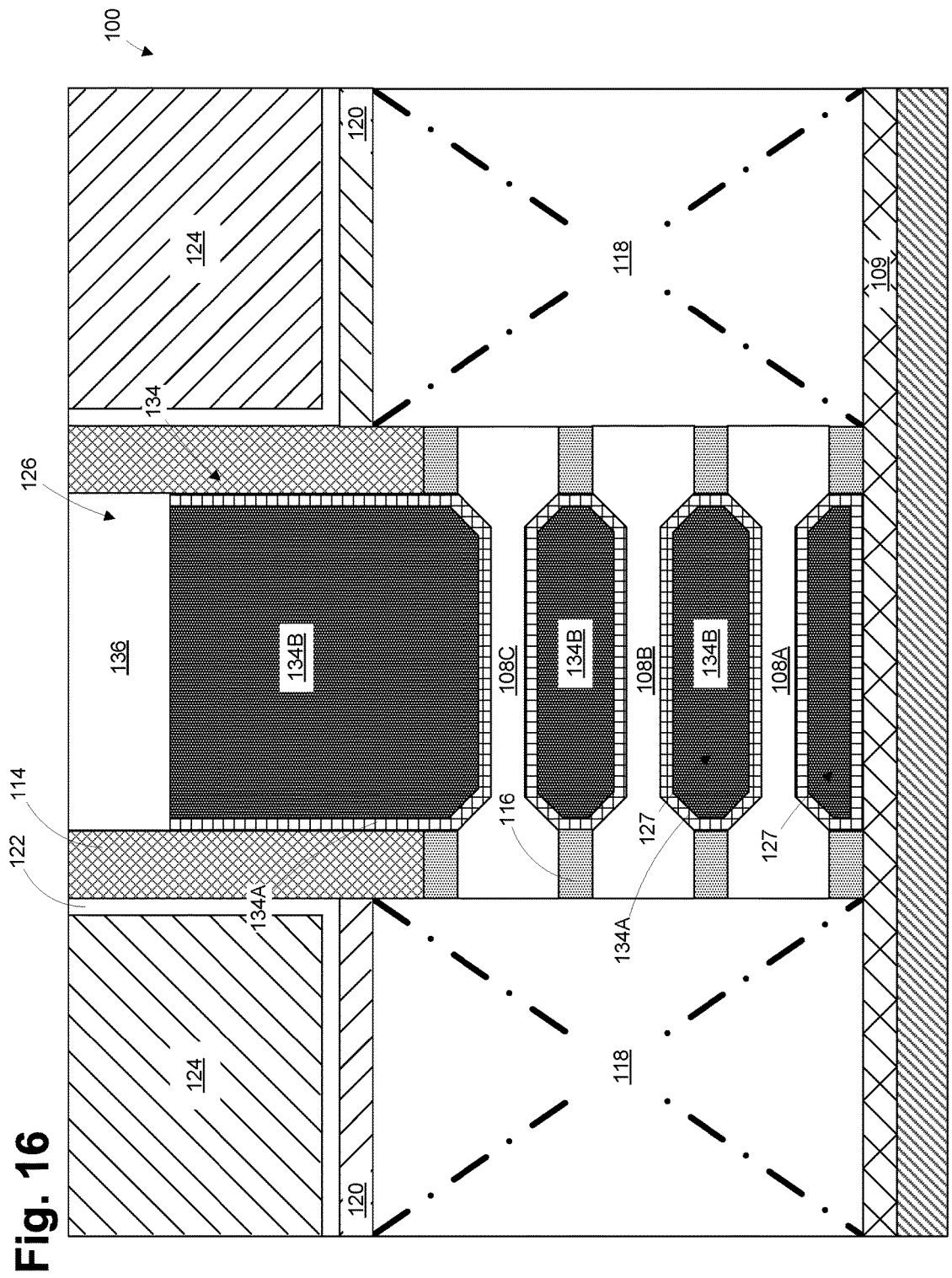

FIG. 16 depicts the device 100 after a simplistically depicted replacement (final) gate structure 134 and a final gate cap (or hardmask) 136 were formed in the replacement gate cavity 126 and in the enlarged areas 127 using well-known manufacturing techniques. Typically, the materials for the final gate structure 134 are sequentially formed in the replacement gate cavity 126. For example, with reference to FIG. 16, a first conformal deposition process may be performed to form a gate insulation layer 134A across the product and within the replacement gate cavity 126 and the enlarged areas 127 between the now-trimmed channel semiconductor material layers 108. Thereafter, one or more deposition processes are performed to form one or more conductive materials in the replacement gate cavity 126 so as to collectively form a conductive gate electrode 134B of the final gate structure 134. For example, in one embodiment, a second conformal deposition process may be performed to form a work function adjusting metal layer (not separately shown) across the product and on the gate insulation layer 134A within the replacement gate cavity 126. In some applications, additional conformal conductive material layers may be formed in the replacement gate cavity 126. Next, a blanket deposition process may be performed to form a bulk conductive material (not separately shown), e.g., tungsten, aluminum, polysilicon, etc. on the work function adjusting metal layer so as to over-fill the remaining unfilled portion of the replacement gate cavity 126. Thereafter, one or more CMP processes may be performed so as to remove excess portions of the gate insulation layer 134A and the conductive materials of the conductive gate electrode 134B that are positioned above the layer of insulating material 124 and outside of the replacement gate cavity 126.

At that point, one or more recess etching processes were performed to recess the vertical height of the materials of the final gate structure 134 within the replacement gate cavity 126 so as to make room (in a vertical sense) for the final gate cap (or hardmask) 136. The final gate cap (or hardmask) 136 may be formed by blanket depositing a layer of the material for the final gate cap (or hardmask) 136 above the device 100 and in the space above the recessed gate structures 134 within the replacement gate cavity 126. Then, another CMP process may be performed using the layer of insulating material 124 as a polish-stop so as to remove excess amounts of the material for the final gate cap (or hardmask) 136. At this point in the processing, the final gate structure 134 with the final gate cap (or hardmask) 136 has been formed on the nano-sheet device 100. Of course, the materials of construction for the final gate structure 134 may vary depending upon whether the device is an N-type device or a P-type device. Additionally, the final gate structure 134 may have a different number of layers of material depending upon the type of device under construction, e.g., the final gate structure 134 for an N-type device may comprise more layers of conductive material than are present in a final gate structure 134 for a P-type device. The gate insulation layer 134A may be comprised of a variety of different materials, such as, for example, silicon dioxide, a so-called high-k (k greater than 10) insulation material (where k is the relative dielectric constant), etc. The work function adjusting metal layer may be comprised of a variety of different materials, e.g., titanium nitride, TiC, TiAlC, W, Al, etc., depending upon the type of device (N or P) being manufactured. The final gate cap (or hardmask) 136 may be made of a variety of different materials, e.g., silicon nitride, SiCN, SiN/SiCN, SiOC, SiOCN, etc.

As will be appreciated by those skilled in the art after a complete reading of the present application, increasing the physical space 127 (as compared to prior art devices) available for formation of the final gate structure 134 (by trimming the channel semiconductor material layers 108) is very beneficial. Among other things, the formation of this relatively large space 127 for gate materials provides device designers with the ability to tailor the materials of the final gate structure 134 to fit specific needs as it relates to transistor characteristics for different transistor devices that are used in different circuits on an IC product. For example, due to the relatively larger space 127, the gate insulation layer 134A may be larger on some transistor devices (e.g., transistors in input/output circuits where low leakage currents is an important consideration) as compared to other transistor devices (e.g., transistors in logic circuits where high switching speeds are required). As another example, that larger space 127 may be beneficial as it relates to the formation of an additional ferroelectric material layer(s) in the gate stack to make a negative-capacitance nano-sheet device. As another example, forming a nano-sheet device with the increased space 127 (as compared to prior art devices) provides designers with greater flexibility to produce devices that have different threshold voltages (as required by some IC products) by permitting the formation of additional work-function metals (or increasing their thicknesses) in the relatively larger space 127 for gate materials in the nano-sheet device disclosed herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming a nano-sheet transistor, comprising:
    forming a patterned stack of materials above a semiconductor substrate, said patterned stack of materials comprising at least one channel semiconductor material layer and first and second layers of sacrificial material positioned above and below, respectively, said at least one channel semiconductor material layer, said at least one channel semiconductor material layer having an initial thickness;
    forming a replacement gate cavity above said patterned stack of materials;
    performing at least one first etching process through said replacement gate cavity to selectively remove at least a portion of said first and second layers of sacrificial material exposed by the formation of said replacement gate cavity relative to said at least one channel semiconductor material layer;
    performing at least one second etching process through said replacement gate cavity to reduce said initial thickness of a portion of said at least one channel semiconductor material layer exposed by the removal of the at least a portion of the first and second layers of sacrificial material to thereby produce a reduced-thickness portion of said at least one channel semiconductor material layer that has a final thickness that is less than said initial thickness; and
    forming a replacement gate structure within said replacement gate cavity and around at least said reduced-thickness portion of said at least one channel semiconductor material layer.

2. The method of claim 1, wherein said at least one channel semiconductor material layer further comprises first and second portions of said at least one channel semiconductor material layer that have said initial thickness, wherein said reduced-thickness portion of said at least one channel semiconductor material layer is positioned between said first and second portions of said at least one channel semiconductor material layer.

3. The method of claim 2, wherein at least a portion of each of said first and second portions of said at least one channel semiconductor material layer are positioned vertically below a sidewall spacer that laterally bounds at least a portion of said replacement gate cavity.

4. The method of claim 1, wherein performing said at least one second etching process through said replacement gate cavity comprises performing at least one of a vapor phase HCl etching process, an etching process comprising $H_2$ and $NH_3$ as etchants or a combination oxidation-etching process.

5. The method of claim 1, wherein performing said at least one second etching process comprises performing said at least one second etching process to produce said reduced-thickness portion of said at least one channel semiconductor material layer that has a final thickness that is about 25-50% less than said initial thickness.

6. The method of claim 1, wherein performing said at least one second etching process comprises performing said at least one second etching process to produce first and second faceted transition regions, respectively, between said first and second portions of said at least one channel semiconductor material layer and said reduced-thickness portion of said at least one channel semiconductor material layer.

7. The method of claim 1, wherein said at least one channel semiconductor material layer comprises silicon and said first and second layers of sacrificial material comprise silicon germanium (SiGe), wherein said first and second layers of sacrificial material comprise different germanium concentrations.

8. The method of claim 2, wherein said reduced-thickness portion has a final width in a gate width direction of said transistor that is less than a final width in said gate width direction of each of said first and second portions.

9. The method of claim 1, wherein said initial thickness of said at least one channel semiconductor material layer is at least 1.5-3 times greater than an initial thickness of either of said first and second layers of sacrificial material.

10. A method of forming a nano-sheet transistor, comprising:
forming a patterned stack of materials above a semiconductor substrate, said patterned stack of materials comprising alternating layers of channel semiconductor material and sacrificial semiconductor material layers, wherein an initial thickness of each of said channel semiconductor material layers is at least 1.5-3 times greater than an initial thickness of each of said sacrificial semiconductor material layers;
forming a replacement gate cavity above said patterned stack of materials;
performing at least one first etching process through said replacement gate cavity to selectively remove at least a portion of said sacrificial semiconductor material layers exposed by the formation of said replacement gate cavity relative to said layers of channel semiconductor material;
performing at least one second etching process through said replacement gate cavity to reduce said initial thickness of a portion of each of said layers of channel semiconductor material exposed by the removal of the at least a portion of the sacrificial semiconductor material layers to thereby produce a reduced-thickness portion of each of said layers of channel semiconductor material, wherein said reduced-thickness portion of each of said layers of channel semiconductor material has a final thickness that is about 25-50% less than said initial thickness of said layers of channel semiconductor material; and
forming a replacement gate structure within said replacement gate cavity and around at least said reduced-thickness portions of said layers of channel semiconductor material.

11. The method of claim 10, wherein each of said layers of channel semiconductor material further comprises first and second portions that have said initial thickness and wherein said reduced-thickness portion is positioned between said first and second portions on each of said layers of channel semiconductor material.

12. The method of claim 10, wherein at least a portion of each of said first and second portions of each of said channel semiconductor material layers are positioned vertically below a sidewall spacer that laterally bounds at least a portion of said replacement gate cavity.

13. The method of claim 10, wherein performing said at least one second etching process through said replacement gate cavity comprises performing at least one of a vapor phase HCl etching process, an etching process comprising $H_2$ and $NH_3$ as etchants or a combination oxidation-etching process.

14. The method of claim 10, wherein performing said at least one second etching process comprises performing said at least one second etching process to produce first and second faceted transition regions, respectively, between said first and second portions on each of said channel semiconductor material layers.

15. The method of claim 11, wherein said reduced-thickness portion has a final width in a gate width direction of said transistor that is less than a final width in said gate width direction of each of said first and second portions.

16. A nano-sheet transistor, comprising:
a gate structure;
a sidewall spacer positioned adjacent said gate structure; and
a channel semiconductor material layer, said channel semiconductor material layer comprising:
first and second portions and a reduced-thickness portion positioned laterally between said first and second portions, wherein said first and second portions have an initial thickness and the reduced-thickness portion has a final thickness that is less than said initial thickness and wherein at least a portion of said reduced-thickness portion is positioned vertically under said gate structure and at least a portion of each of said first and second portions is positioned vertically under said sidewall spacer and wherein said gate structure is positioned around at least a portion of said reduced-thickness portion of said channel semiconductor material layer.

17. The transistor of claim 16, wherein said final thickness is about 25-50% less than said initial thickness.

18. The transistor of claim 16, further comprising first and second faceted transition regions, respectively, between said first and second portions of said channel semiconductor material layer and said reduced-thickness portion of said channel semiconductor material layer.

19. The transistor of claim 16, wherein said reduced-thickness portion has a final width in a gate width direction of said transistor that is less than a final width in said gate width direction of each of said first and second portions.

20. The transistor of claim 19, wherein said gate structure comprises a high-k gate insulation layer and at least one layer of a metal-containing material.

\* \* \* \* \*